United States Patent [19]
Buchanan et al.

[11] 3,984,830
[45] Oct. 5, 1976

[54] COMPLEMENTARY FET DIGITAL TO ANALOG CONVERTER

[75] Inventors: James E. Buchanan, Bowie; Joel E. Brown, Baltimore, both of Md.

[73] Assignee: Westinghouse Electric Corporation, Pittsburgh, Pa.

[22] Filed: Oct. 18, 1974

[21] Appl. No.: 515,945

[52] U.S. Cl. .................. 340/347 DA; 340/347 CC
[51] Int. Cl.² ........................................ H03K 13/02
[58] Field of Search ............. 340/347 DA, 347 AD, 340/347 CC

[56] References Cited
UNITED STATES PATENTS

| | | | |
|---|---|---|---|
| 3,307,173 | 2/1967 | Popodi et al. | 340/347 DA |
| 3,355,670 | 11/1967 | Pastoriza | 340/347 DA |
| 3,462,757 | 8/1969 | Brown | 340/347 DA |
| 3,544,994 | 12/1970 | Hanson et al. | 340/347 DA |
| 3,611,353 | 10/1971 | Shipp | 340/347 DA |

OTHER PUBLICATIONS
"Electronics" Sept. 29, 1969, pp. 50–51.

Primary Examiner—Charles D. Miller
Attorney, Agent, or Firm—D. Schron

[57] ABSTRACT

A D/A conversion circuit has each branch of its resistive binary scaling network energized by a switchable network. Each switchable network employs the internal current paths of an Integrated Circuit (I.C.) solid state device, such as a Complementary-Metal-Oxide Semiconductor-Field-Effect-Transistor (CMOSFET) device, which provides complementary switching action. Each switchable network also employs a Metal-Silicon (M-S) diode, which provides clamping and diode switching actions. By a combination of I.C. device and M-S diode device actions, the following features are achieved in a single circuit: (A) high accuracies, (B) fast setting times and (C) low power consumption. Also disclosed is a cooperating variable D/A reference potential source which achieves temperature compensation.

9 Claims, 3 Drawing Figures

FIG.1

COMPLEMENTARY FET DIGITAL TO ANALOG CONVERTER

BACKGROUND OF THE INVENTION

This invention relates to a digital-to-analog (D/A) converter circuit for applications which have the combined objectives of: (A) accuracies of the order of 1 part in 1000 parts, (B) circuit settling times of the order of 50 nanoseconds or less, and (C) power consumption of the order of five milliwatts per bit or less.

There is much need for an analog-to-digital converter having the foregoing combination of performance objectives in such areas of technology as control systems for satelite vehicles or airborne fire control systems. Further, if such a circuit could be constructed at a cost comparable to that of existing general purpose converters, it would offer the advantage of low-power consumption for any application.

It is a well recognized design principle that the tolerances of accuracy of the voltage output from the driver stages at the front end of a converter circuit are a primary consideration in achieving D/A converter accuracy. Prior to the advent of field effect transistor (F.E.T.) technology, there existed a dichotomy in trying to achieve both the accuracy and low power. The active circuit devices which existed prior to F.E.T. technology posed problems of "voltage offset" in circuit constructions. Voltage offset is the unpredictable variations in the output voltage of an active device. This was particularly a problem where a stage had to drive lower impedance loads. On the other hand, the primary design approach for improving the accuracy of resistive scaling networks involves decreasing the impedance load. One attempt to overcome this dichotomy was to employ a saturation drive complementary grounded-emitter bipolar transistor switch as the drive stage. However, the high base current drive required for low offset resulted in the disadvantage of a large stored charge in the base regions of the device. This, in turn, placed an unacceptable constraint upon settling times, as well as undesired power dissipation. For a discussion of the difficulties of this approach, see "Digital-To-Analog Converter Handbook" published in 1970 by Hybrid Systems Corporation of Burlington, Massachusetts. U.S. Pat. No. 3,014,211 to H. C. Bussey is an example of another approach to overcoming this dichotomy. There, the patentee overcomes the voltage offset problem by means of a network of resistors and back-to-back Zener diodes, to provide two level clamping in a circuit path employing a conduction control device as the switch device. The implementation disclosed in that patent is inherently contrary to a low power consumption objective, because of the high current flows involved. It is also contrary to the objective of high circuit settling speeds because of the high RC time constants connected with the resistive circuits, and the capacitance exhibited by the Zener diodes. Further, it would be difficult to achieve a high degree of accuracy due to the inherent mismatch in Zener voltages initially and with temperature variation.

The advent of junction-type Field Effect Transistor (FET) devices appeared to offer a solution to the problem of meeting the three combined objectives. These devices are known to work well in complementary switch configurations for purposes of providing accurate and high-speed driver stages. However, it can be shown that the objective of accuracy is primarily dependent upon very percise matching of individual devices, which can only be achieved by the fabrication of a multiplicity of these devices as a complete integrated circuit system on a single substrate. Whatever the reason, junction FET's are not available, or at least not commercially available, in this mode of fabrication.

General (in contrast to complementary) Metal-Oxide-Semiconductor-Field-Effect-Transistor (MOS-FET) devices are commercially available in modes of fabrication providing units having high packaging density on a single substrate, but not available with the high degree of match needed for high order D/A accuracies. Employing these devices for Tee configuration driver stages of high accuracy analog-to-digital converters is known. However, this configuration of driver necessitates the employment of high impedance ladder-type binary scaling networks which redue the speed of the D/A. Examples of these are the U.S. Pat. No. 3,755,807 to J. L. Brown and U.S. Pat. No. 3,646,587 to E. L. Shaffstall, et al. Also, the Tee configuration involves power consumption levels which substantially exceed five milliwatts per bit.

The advent of Complementary Metal-Oxide-Semiconductor-Field-Effect-Transistors (CMOSFET) devices also had obstacles to their use in D/A converters. Prior to the present invention, the well-known nonsymmetrical operating characteristics of their constituent P-channel and N-channel elements was considered a serious obstacle to accuracy. This nonsymmetrical behavior is described in detail in the following publications: RCA Solid State Data Book Series SSD-203A, 1973 Edition, published by RCA Corporation, Somerville, NJ, pps. 395–397, and McMos Integrated Circuits Data Book published by Motorola, Inc, 1973 pps. 1–3 and 1–4, and 2–9 and 2–13 and 2–14. The foregoing text materials also describe the substantial variation with temperature of the operating characteristics of CMOSFET devices, which prior to the present invention was considered a serious obstacle to any application under varying temperature conditions.

SUMMARY OF THE INVENTION

A D/A conversion circuit comprises a conventional binary resistor scaling network with each resistive branch thereof operated by a switchable network which employs the internal current paths of an Integrated Circuit (I.C.) Complememtary-Metal-Oxide-Semiconductor-Field-Effect-Transistor (CMOSFET) device. Each network also includes a metal-silicon (M-S) diode which is used as a clamping device and as a switching diode. In one of its states, the switchable network establishes a circuit from a high potential source to a potential source having a lower magnitude of potential. The M-S diode acts as a diode clamp, establishing a voltage equal to the lower potential plus the predetermined diode forward voltage drop. The voltage established by the clamping action is used as a reference potential for application to the corresponding branch of the binary network. In its other state, the switchable network switches the branch of the binary network to a ground return, with the M-S diode acting as a diode switch to prevent application of the lower potential to the branch of the network. For applications under widely varying temperature conditions, the lower potential applied to the switchable network is provided by an operational amplifier circuit with reference inputs provided by networks having matching CMOS-FETS and M-S diodes. The output of this circuit varies in an inverse relationship to temperature change induced variations in forward voltage drop of the M-S diode. In turn, this makes the accuracy of the D/A conversion circuit independent of temperature conditions.

DESCRIPTION OF THE PREFERRED EMBODIMENT

Figure 1:
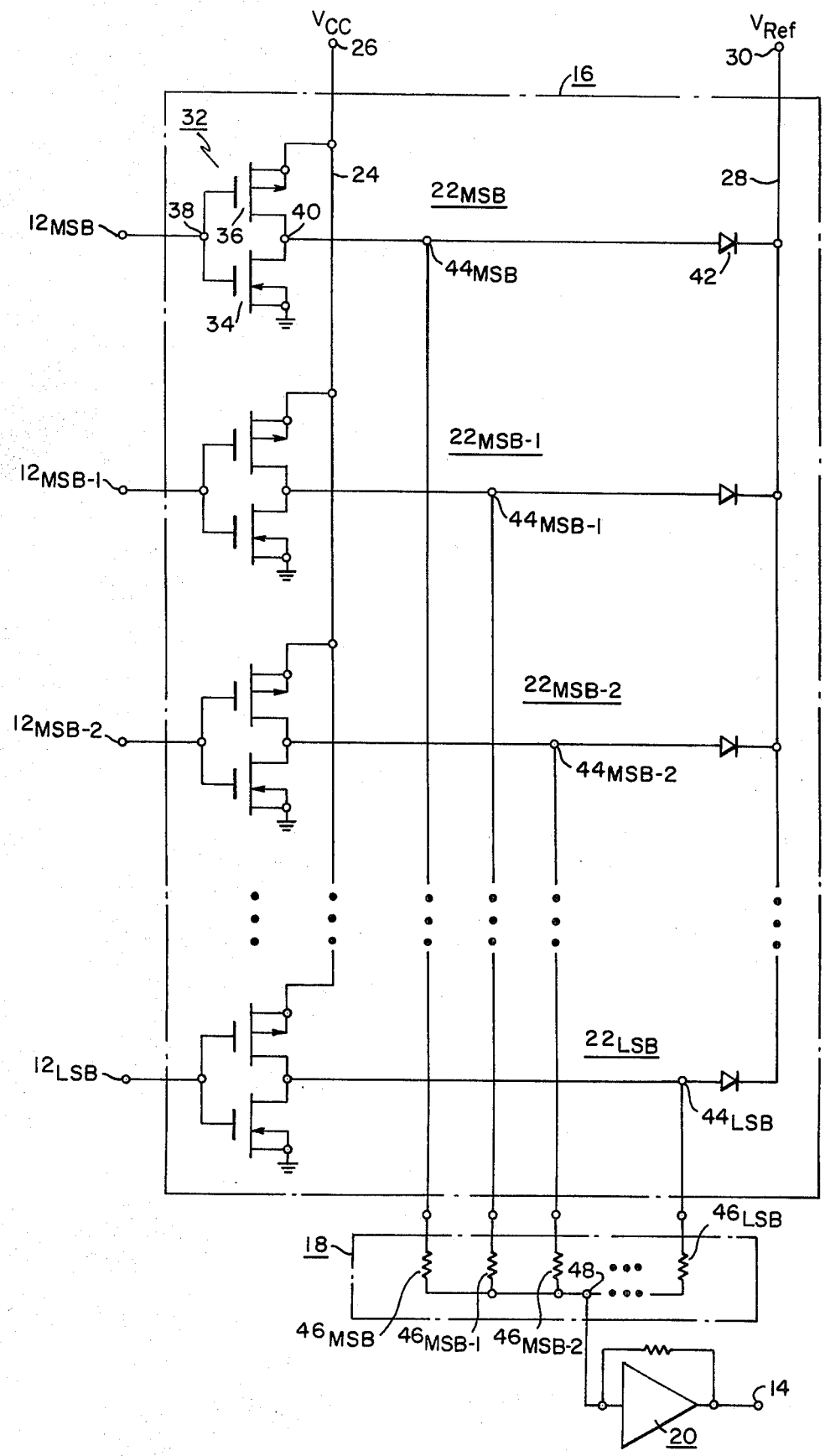
FIG. 1 is a circuit diagram of an embodiment of a D/A converter circuit in accordance with the invention, in which for purposes of simplicity certain redundant portions are cut away.

Referring now to the drawings, and particularly to FIG. 1, a digital-to-analog (D/A) conversion circuit 10 in accordance with the present invention has a series of bit signal input terminals $12_{MSB}$, $12_{MSB-1}$, $12_{MSB-2}$ . . . $12_{LSB}$, and an analog output signal terminal 14. The major subcomponents of circuit 10 are a reference voltage switching matrix 16, a D/A resistor network 18, and an output buffer amplifier 20.

A binary digital word composed of a series of bit signals, with each position in said series representing a binary bit position value is applied to the series of terminals 12. As indicated by the subscripts MSB, MSB-1, MSB-2, LSB, the bit signal representing the most significant bit (MSB) is applied to terminal $12_{MSB}$, that representing the next lower bit position value to the next terminal $12_{MSB-1}$, and so forth with the least significant bit (LSB) applied to terminal $12_{LSB}$. An analog voltage signal having a magnitude corresponding to the binary digital value of the signal applied to terminals 12 appears at the output terminal 14. A typical application of circuit 10 would be a control system for a satellite. Typical requirements for such system would be to convert a ten-bit digital input word to an analog signal at a 10 megahertz rate. Such a system requires a circuit settling time of less than 50 nanoseconds. Obviously, electrical power is at a great premium within a satellite vehicle, which imposes power consumption constraints of the order of 5 milliwatts per bit. Yet accuracies of 1 part in 1000 parts are needed. Matrix 16 includes a series of switchable networks $22_{MSB}$, $22_{MSB-1}$, etc., one for each input terminal. A line 24 is connected to a source 26 of FET operating potential $V_{CC}$. A typical magnitude of $V_{CC}$ is +12 volts. A line 28 is connected to a source 30 of A/D reference of potential $V_{ref}$. A typical magnitude of $V_{ref}$ is 6 volts. Source 30 is of a conventional type providing a highly precise voltage reference which remains fixed under changing loads, commonly referred to as a current source.

The circuit components of each switchable network are identical, and therefore, the following description with respect to network $22_{MSB}$ will serve for all the other networks in matrix 16. An integrated circuit (I.C.) Complementary-Metal-Oxide-Semiconductor-Field-Effect-Transistor (CMOSFET) device 32 forms the front end of network $22_{MSB}$. Device 32 is a conventional configuration obtainable as a fabricated unit. In internal circuit structure it is composed of dual Metal-Oxide-Semiconductor-Field-Effect-Transistor (MOSFET) switch elements, consisting of an N-channel element 34 and a P-channel element 36. The sink-source path of N-channel element 34 is serially connected to the sink-source path of P-channel element 36. The respective gate electrodes of the elements are coupled together to form a device input terminal 38. The junction point of the serially connected sink-source paths of elements 34 and 36 forms a device output terminal 40. The sink electrode of the N-channel element 34 is coupled to ground. The source electrode of P-channel element 36 is connected to line 24. It will be understood that the structure of device 32 thus far described is an integral fabricated unit. The signal from terminal $12_{MSB}$ is applied to the device input terminal 38; and the device output terminal is coupled to the anode of a high speed metal-silicon (M-S) type diode 42. The cathode of diode 42 is connected to the A/D reference potential line 28. The output of switchable network $22_{MSB}$ is a tap point $44_{MSB}$ located along the line connecting output terminal 40 of device 32 and the anode of diode 42. Corresponding tap points $44_{MSB-1}$, $44_{MSB-2}$ . . . $44_{LSB}$ are located along the corresponding lines of other switchable networks.

D/A resistor network 18 contains scaling resistors $46_{MSB}$, $46_{MSB-1}$, etc. Each resistor constitutes an impendance branch of conventional D/A resistor network to provide individual binary weighted branch currents. That is, the magnitudes of resistance, starting with resistance $46_{MSB}$, vary in accordance with the Series R, 2R, 4R, . . . $2^NR$. The input ends of the resistors are connected to the respective tap points $44_{MSB}$, $44_{MSB-1}$, etc. The output ends of the resistors form a summing junction 48 which is coupled to the input of the output buffer amplifier 20.

Amplifier 20 is a conventional general purpose operational amplifier, and in accordance with well-known principles of operation, its input constitutes a virtual ground point. The latter feature eliminates circuit settling delays which could otherwise be present because of an RC time constant associated with the D/A resistor network output.

The CMOSFET device 32 is selected from those commerically available units which have a plurality of individual devices 32 on a common substrate. The devices from a single unit having a common substrate are used for successive switchable networks $22_{MSB}$, $22_{MSB-1}$, $22_{MSB-2}$, so that the switchable networks for the MSB end of the series will have operating characteristics which tend to be exactly equal. The MSB resistive branches effect accuracy in proportion to the weight value of their binary position, which makes the MSB end of the series critical in establishing circuit accuracy.

Metal-silicon diodes 42, which are sometimes referred to as hot carrier diodes, employ a metal-silicon Schottky barrier junction and provide picosecond switching speeds. They store very little charge and thus do not add a significant amount of charge or capacitance in the operation of network 22. Generally, the exact forward voltage drop of such diodes is known. Further, all the diodes 42 in matrix 16 are of a common batch matched set, which has been identified by their manufacturer as fabricated at the same time. Devices in such a set have operating characteristics which tend to be exactly equal. A typical value of forward voltage drop of such a diode in its ON condition is 0.4 volts.

In the operation of circuit 10 the binary input signals received at terminals $12_{MSB}$, $12_{MSB-1}$, etc., are alternatively in the form of a LOW digital state represented by a ground potential or near ground level potential voltage or a HIGH digital state represented by a voltage of the order of 12 volts. Such LOW and HIGH states represent binary bit values of ONE and ZERO, respectively. Assume then that a ONE binary state consisting of ground reference voltage is applied to terminal $12_{MSB}$. In accordance with the well known mode of operation of a CMOSFET driver stage, the sink-source path of the P-channel element 36 will be conductive and the sink-source path of the N-channel will be nonconductive, resulting in the establishment of a closed circuit path from the 12 volt source 26 to the 6 volt source 30 through output terminal 40 and diode 42. The sink-source path of the P-channel element 36 exhibits an ON resistance having a value in a range of 200 ohms – 1 K ohms. This value will vary between the different commercial sources of device 32. This ON resistance cooperates as a limiting resistance in limiting the current through diode 42. The potential appearing at tap point $44_{MSB}$, which is the potential applied to the energization end of scaling resistor $46_{MSB}$, is equal to $V_{ref}$ plus the ON forward voltage drop of diode 42, $V_F$. This potential is sometimes hereinafter referred to as the Modified A/D Reference Potential, $V_{ref'}$. $V_{ref'}$ energizes the impedance branch of network 18, causing a predetermined current component representing a binary one weighted in accordance with the most significant bit position value to flow through summing junction 48. Stated mathematically:

$$I_{MSB} = \frac{V_{ref'}}{R_{46MSB}}$$

where $I_{MSB}$ equals the current due to energization of resistor $46_{MSB}$, and $R_{46MSB}$ is the value of resistance of resistor $46_{MSB}$.

Next, assume that a ZERO binary bit sign state consisting of a magnitude of potential of 12 volts is applied to terminal $12_{MSB}$. The states of the two sink-source paths CMOSFET device 32 are reversed. The sink-source path of the P-channel element 36 is nonconductive, abd the sink-source path of the N-channel element 34 is conductive and exhibits an ON resistance of approximately twenty (20) ohms. CMOSFET device 32 in effect switches the anode of diode 42 to ground and thereby renders the diode nonconductive. Accordingly, tap point $44_{MSB}$ is effectively coupled to ground which deenergizes the branch of resistive network 18 which consists of resistor $46_{MSB}$.

The same principle of operation governs each individual switchable network of the series $22_{MSB}$, $22_{MSB-1}$, etc. Tap points $44_{MSB}$, $44_{MSB-1}$, etc., will alternatively be substantially at ground reference level or at $V_{ref'}$, depending upon the state of signal at input terminals $12_{MSB}$, $12_{MSB-1}$, etc. In accordance with well known principles of operation, the A/D resistor network 18 responds to the selective presence of $V_{ref'}$ at its resistive branches $46_{MSB}$, $46_{MSB-1}$ by providing branch currents which are accurately scaled to represent the position value of the corresponding digit of the data work applied to input terminals $12_{MSB}$, $12_{MSB-1}$, etc. Summing junction 48 combines these currents and applies them to the input buffer amplifier 20, which at its output provides an analog signal which accurately represents the binary value of the digital word applied to input terminals $12_{MSB}$, $12_{MSB-1}$, etc.

The series of impedance values for scaling resistors $46_{MSB}$, $46_{MSB-1}$, etc. are so chosen that the minimum resistance of any of them, which is the resistance of the most significant bit resistor $46_{MSB}$, is very large compared with the twenty (20) ohm ON resistance through the sink-driver path of N-channel element 35. Thus, the twenty (20) ohm ON impedance does not cause a significant error in the MSB bit.

Those skilled in the art will recognize that D/A converter circuit 10 achieves high accuracy. Accuracy is primarily dependent upon the voltage drop being well matched across the diodes 42 in the switchable networks 24 for the more significant bits. The voltage drop across the diode is a function of the initial match of the diodes and the match of the current to the diodes. Metal-silicon diodes are commercially available in batches having forward voltage drops, $V_F$, within tolerance limits of 5 millivolts in the 0.5 to 10 milliamp range. The current match is primarily determined by the On resistance of the CMOSFET devices. Typical tolerances of ON resistances of the sink-source path of the P-channel elements are within 15 ohms tolerance limits, with a corresponding absolute resistance of 300 ohms. Thus, the maximum percentage mismatch is $15/300 \times 100 = 5\%$. At a typical bias current level of 1 milliamp, the current mismatch due to CMOSFET device resistance differences would be $0.05 \times 1$ ma. $= 50$ uamp. Using a $\Delta V/\Delta I$ diode curve slope, $$\frac{\Delta V}{\Delta I} \approx 26 \text{ ohms at 1 ma,}$$

the maximum voltage drop difference due to I.C. CMOSFET operating characteristic tolerances would be 26 ohms $\times$ 50 $\mu$amp = 1.3 millivolts. A maximum voltage drop difference of 1.3 millivolts is much below the initial 5 millivolt batch match limits of the diodes. Therefore, it can be concluded that the diode forward voltage drop match can be maintained sufficiently close so that high D/A converter accuracy is provided in accordance with the present invention. Further, the output impedance of the CMOSFET device will not cause an error when its output terminal is switched to ground, since a CMOSFET switch device has no voltage offset.

Those skilled in the art will also recognize that the circuit in accordance with the present invention has the capability of processing conversions with high speed and short settling times. CMOSFET switch devices are available with switching times under 50 nanoseconds. Such devices do not present a charge storage problem, such as is presented by low offset voltage chopper transistors. The CMOSFET devices provide both an active pull-up and pull-down, respectively, by the P-channel and the N-channel, to extremely rapidly charge or discharge the small amount of stray capacitance on the output of the driver stages. Metal-silicon diodes are extremely fast. They store little charge, and thus do not add a significant amount of charge or capacitance to the driver stages. As previously described, operating the output summing point of the binary scaling resistor network at virtual ground eliminates any RC time constant problems connected with the resistance branches.

Further, those skilled in the art will recognize that a circuit in accordance with the present invention dissipates little power. A CMOSFET device has no internal DC power dissipation except for a maximum current leakage power dissipation of 100 $\mu$W. In their OFF state, there is no DC load current. Therefore, no DC power is dissipated in this state. In their ON state, the load current to the resistor network is very small. Under the typical situation of establishing a diode bias current in the range 0.5 to 2.0 ma., by a differential of 1 or more volts between the FET operating potential, $V_{CC}$, and A/D reference voltage, $V_{ref}$, the DC power dissipation in the ON state would be approximately 1 milliwatt per bit. Dynamic average power, which is calculated by the expression Dynamic Average Power = $CV^2F$, would add to the above DC power calculations, but total power would not exceed 5 milliwatts per bit.

An important feature of the present invention may be stated from another viewpoint. Namely, the circuit in accordance with the present invention enables one to employ a CMOSFET device with its inherent advantages of speed and power for the circuit driver stage, despite the mismatch between the P-channel and the N-channel elements of the device.

Figure 2:
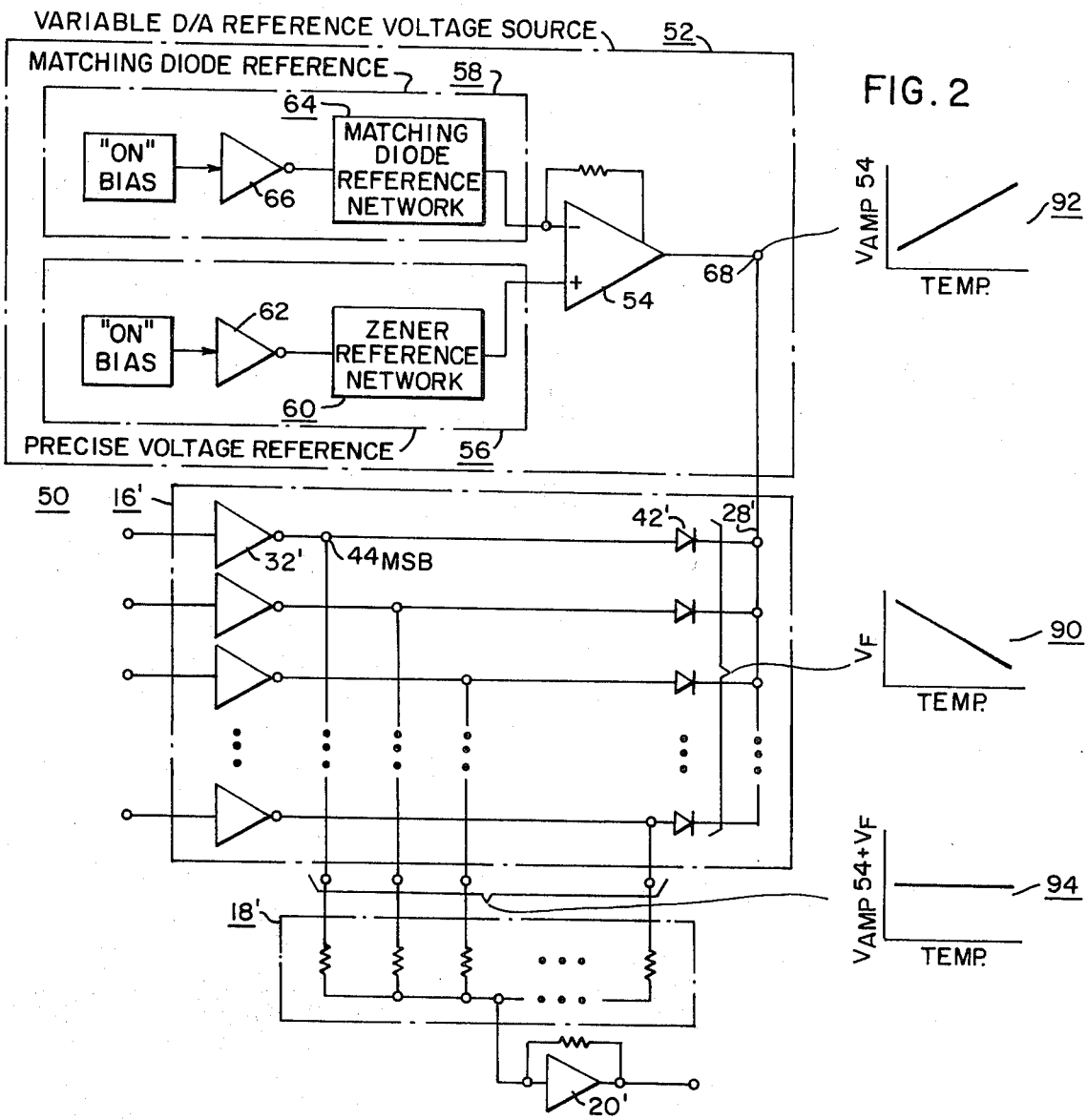
FIG. 2 is a schematic block diagram of a system composed of a D/A converter circuit like that of FIG. 1, and a cooperating voltage supply circuit of special utility in applications in which the converter is to operate under varying temperature conditions.

The accuracy of the system of FIG. 1 meets the criterion for high accuracy applications when employed where ambient temperatures are not subject to wide variation. However, for applications in which the equipment is subject to wide variations of temperature, there is a degradation of absolute accuracy because of the changes of forward voltage drop $V_F$ of diodes 42, and because of changes of output impedance of the CMOSFET device. The degradation of absolute accuracy under such circumstances may be overcome by the modified D/A system 50 of FIG. 2. In FIG. 2, components identical to those hereinbefore described in FIG. 1 are designated by the same reference numeral with the addition of a single prime symboy (') as a suffix. System 50 is composed of a reference voltage switching matrix 16', D/A resistor network 18', output buffering amplifier 20', and additionally includes a variable D/A reference voltage source 52. The variable voltage source 52 interacts with switching matrix 16' to provide temperature compensation.

Reference is again made to FIG. 2 to broadly describe the components of modified system 50 which are involved in this interaction. Variable voltage source 52 comprises a differentially summing amplifier 54 and two reference sources connecting to respectively one and the other of the amplifier inputs. These two sources consist of precise voltage reference 56 and matching diode reference source 58. As the name implies, source 56 provides an accurate voltage reference. It consists of a Zener diode reference network 60 and an ON biased I.C. CMOSFET device 62 which is a current source to network 60. The circuit construction network 60 will be more fully described in the next paragraph, but for present purposes, it is adequate to say that it employs the well known technique of using the voltage drop across an ON biased Zener diode device as a precision source of reference voltage. Device 62 establishes the bias current through the Zener device in network 60. Matching diode reference source 58 consists of a matching diode reference network 64 and another ON biased I.C. CMOSFET device 66 which establishes the current through reference network 64. Network 64 includes a diode selected for match with the switching-clamping diodes 42' of switching matrix 16'. The purpose of matching diode reference source 58 is to provide a reference potential which is as near as possible identical to the drop exhibited by the diodes 42'. The I.C. CMOSFET device 62 establishes the bias current through the matching diode in network 64. Differential summing amplifier has unity gain, and it serves three functions. Firstly, it provides an output which is a difference voltage equal to the magnitude of voltage from the precise reference source 56 minus the magnitude of voltage from the matching diode reference source 58. Secondly, it provides a load driving capability. Thirdly, it presents a high impedance to reference sources 56 and 58. The output terminal 68 of amplifier 54 connects with D/A reference potential line 28' of the switching matrix 16'. Line 28', in turn, applies the output of variable voltage source 52 to the cathode sides of diodes 42' in switching matrix 16'.

Figure 3:
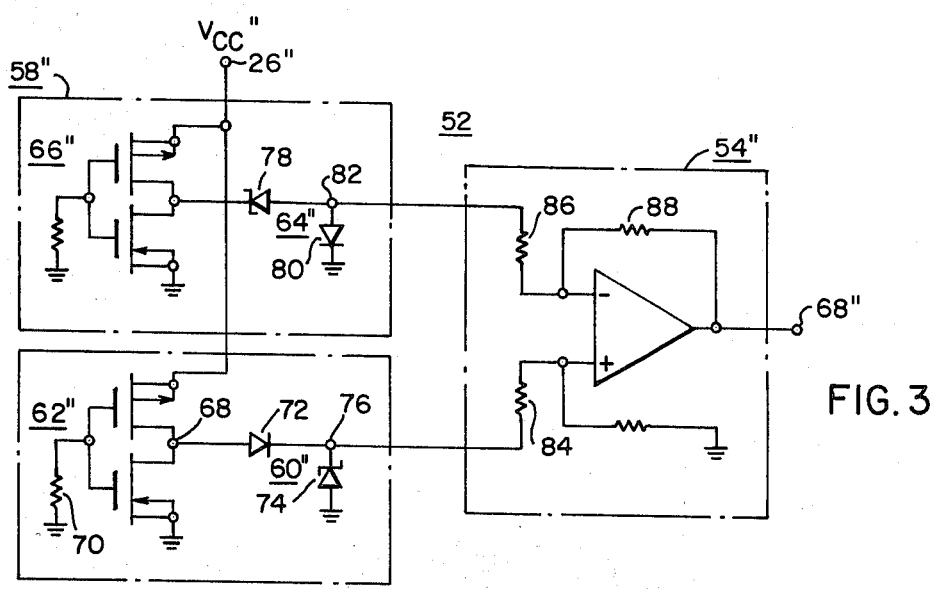
FIG. 3 is a circuit diagram of the voltage supply circuit of FIG. 2.

Reference is now made to FIG. 3 which shows a circuit diagram of variable D/A reference voltage source 52. Components identical to those heretofore described are designated by the same reference numeral followed by a double prime ('') suffix. I.S. CMOSFET device 62'' of precise voltage reference source 56'' is identical to device 32' (FIG. 2) in switching matrix 16' (FIG. 2). Further, device 62'' and devices 32' are of a common batch matched set, furnished by their manufacturer. A signal of ground or near ground potential is applied to the input terminal of device 62'' so that its P-channel is always On, closing a current path between FET Operating Potential source 26'' to the output terminal 68 of the device. One suitable way of applying this bias signal to the input terminal of device 62'' is by the connection of same to ground through a resistor 70. Zener diode reference network 60'' is connected between the output terminal 68 of device 62'' and ground. Network 60'' is a two-element serial network, consisting of a diode 72, a Zener diode device 74 connected between output terminal 68 and ground and in that order. Diode 72 is identical to and of the same batch matched set as diodes 42' (FIG. 2) in switching matrix 16' (FIG. 2). The potential at a junction point 76, located between diode 72 and Zener diode device 74, is applied to the noninverting input of the differentially summing amplifier 54''. The potential at point 76 is hereinafter sometimes referred to as $V_{ref-1}$. As is well known, the magnitude of potential drop across a Zener diode device is an accurate reference. The reason for inclusion of diode 72 as well as Zener diode device 74 in Zener diode reference network 60'' will become apparent as the description proceeds. A choice of particular Zener diode device and the magnitude of FET operating potential $V_{CC''}$ is made such that the level of current bias through both diodes 72 and Zener diode device 74 is a magnitude which is above the knee of the current-voltage curve of each of these devices. In a typical circuit in which this relationship is achieved, the Zener diode device will exhibit a potential drop of 5–7 volts thereacross and the magnitude of the FET operating potential $V_{CC''}$ would be approximately 10 volts.

Within matching diode reference source 58'', an I.C. CMOSFET device 66'' is ON biased in the same manner as device 62''. Device 66'' provides the bias current for matching diode reference network 64''. Network 64'' is a two-element serial network, consisting of a Zener diode device 78 and diode 80 connected between the output terminal of CMOSFET device 66'' and ground and in that order. Zener diode device 78 is identical to device 74, and diode 80 is identical to and of the same batch matched set as diodes 42'' (FIG. 2) in matrix 16' (FIG. 2). The potential at junction point 82, located between Zener diode device 74 and matching diode 76, is the forward voltage drop across matching diodes 74 and is applied to the inverting input of differentially summing amplifier 54''. The potential at point 82 is sometimes hereinafter referred to as $V_{rer-2}$.

It is to be noted that since Zener diode reference network 60 and matching diode reference network 64 both consist of identical serially connected Zener devices and doides, the loads presented to CMOSFET devices 62'' and 66'' will be identical, so that the bias current of the two networks will be equal.

Differentailly summing amplifier 54'' is of the conventional operational amplifier type construction. It includes input resistors 84 and 86 and a feedback resistor 88. Resistors 84, 86, and 88 are chosen to provide unity gain amplification of the potential applied to its noninverting input, minus the potential applied to its inverting input.

The interaction between variable D/A reference voltage source 52 and switching matrix 16' under varying temperature conditions will now be described with reference to FIGS. 2 and 3. The forward voltage drop $V_F$ of a metal-silicon diode decreases approximately linearly with an increasing temperature. The resultant variation of forward voltage drop $V_F$ across diodes 42' in switching matrix 16' is symbolically depicted by the graph 90 shown in FIG. 2. The potential at the output terminal 68 of differentially summing amplifier 54 is equal to the difference of the amplifier input voltages That is $$\text{Output} = V_{ref\,1} - V_{ref\,2}$$

Because the voltage across diode 80 is applied to the inverting input of amplifier 54, the voltage versus temperature at output terminal 68 will be as symbolically depicted in graph 92, namely, inversely related to the voltage drop versus temperature across diodes 42'. When a HIGH input signal is applied to any of binary input signal terminals 12, the voltage present at the energizable end of the corresponding scaling resistor 46 is:

$$V \text{ to resistor} = V_{amp\,54} + V_F,$$

hence, $$V \text{ to resistor} = V_{ref\,1} - V_{ref\,2} + V_F,$$

but, $$V_{ref\,2} = V_F,$$

and therefore, $$V \text{ to resistor} = V_{ref\,1}.$$

$V_{ref\,1}$ is the Zener diode device voltage drop. Thus, the net effect of the interaction of variable voltage source 52 and switching matrix 16' is to maintain the equality of the precise potential applied to the resistive branches of binary resistor network 18' under conditions of varying temperature as depicted by graph 94.

The constructions of precise voltage reference 56 and of matching diode reference 58 are important. In both reference 56, and reference 58, the bias current levels in the Zeners are established by matching I.C. CMOSFET devices. In both reference 56 and in reference 58, the loads seen by the CMOSFET device are a two-element serial network composed of a Zener diode device and a diode. This combination insures that the bias currents through identical and matching diodes 72, 80, and 42' (plurality) are equal. This, in turn, causes the changes in output of the variable D/A reference voltage source 52 to accurately compensate for the changes in forward voltage drop $V_F$ of the metal-silicon diodes 42' in the switching matrix 16' with a degree of accuracy limited only by the tolerances of operating characteristics of the component devices.

Variable D/A reference voltage source 52 has for purposes of clarity of explanation been described as a system element which interacts with a single D/A conversion circuit. However, the output of source 52 will typically be applied to a large number of conversion circuits. Stated another way, variable D/A reference voltage source 52 can be considered to be a modification to an existing source of potential.

Circuit 10 and modified D/A system 52 are hereinbefore described in an embodiment having the simplest form of A/D resistive network, namely, parallel resistors 46. However, D/A circuits and systems in accordance with the invention may employ more sophisticated D/A resistive networks. Examples of such sophisticated networks include ladder networks and networks which provide conversion of different binary code values, such as octal values or binary coded decimal (BCD) values.

What we claim is:

1. Circuit apparatus for producing an analog representation of a series of concurrently present binary input signals which respectively represent binary digital values weighted in accordance with a predetermined series of bit position values, said circuit apparatus comprising:
    a. a current scaling network comprising a corresponding series of impedance branches each of which has an energizible end and is adapted to scale current as a predetermined function of the corresponding bit position value,
    b. a first voltage source for providing a first circuit apparatus operating potential having a predetermined polarity relative to a ground reference potential and having a predetermined magnitude,
    c. a second voltage source for providing a second circuit apparatus operating potential having the same polarity and having a magnitude less than said first predetermined magnitude,
    d. a corresponding series of switchable networks, each network of said series being switchable between a first network condition which establishes a first circuit path extending between a conductor at said ground reference potential and the energizable end of the corresponding impedance branch of the current scaling network, and a second network condition which establishes a second circuit path extending between the first voltage source and the second voltage source and which includes an energization tap point directly coupled to said energizable end of said corresponding branch,
    e. the second circuit path of each switchable network means having operatingly associated therewith a clamping means for clamping the potential at said energization tap point to a magnitude of potential which is in predetermined relationship to said second circuit apparatus operating potential when said second circuit path is established, f. a corresponding series of switching means, each switching means of said series being for controlling the switchable network in response to the corresponding binary input signal, g. each of said switching means comprising a complementary acting solid state switching device of the type comprising a complementary pair of first and second elemental solid state units, each elemental solid state unit having a gate electrode and a sink-source path under control of the gate electrode, said complementary acting solid state device further being of the type in which the sink-source paths of the first and second elemental solid state units are serially connected, h. said complementary acting device having a circuit junction point where the sink-source paths of the first and second elemental solid state units are joined in series, i. said complementary acting device being connected with its serially connected sink-source paths coupled between ground reference potential and said first voltage source and with the corresponding binary input signal coupled to the gate electrodes of both elemental solid state units, said complementary acting devices being operably responsive to the state of binary input signal to switch the complementary acting device between a first complementary acting device condition in which the sink-source paths of a one and the other elemental devices are in a closed circuit condition and in an open circuit condition respectively, and a second complementary acting device condition in which the sink-source paths of said one and the other of said elemental devices are in an open circuit condition and a closed circuit condition, respectively, j. said first circuit path including the sink-source path of a one of said first and second elemental solid state units, and said second circuit path including the sink-source path of the other of said first and second elemental solid state unit, k. the clamping means of the second circuit path of each switchable network being a diode connected between the energization tap point and said voltage source, l. said second voltage source comprising a precision reference potential circuit means, a diode drop reference potential circuit means, and a unitary gain, differentially summing amplifier, m. said precision reference potential circuit means comprising a fixed voltage drop means and a voltage drop means bias current network, said voltage drop means bias current network including another complementary acting solid state switch device substantailly identical to those of each switching means and another diode substantially identical to those of clamping means, n. said diode drop reference potential circuit means comprising still another diode substantially identical to those of each clamping means and a diode bias current network, said diode bias current network including still another complementary acting solid state switch device substantially identical to those of each switching means and a second voltage drop means substantially identical to said first voltage drop means, o. said unity gain differentially summing amplifier being operative to vary the magnitude of potential of second circuit apparatus operating potential as a function of the potential drop across the fixed voltage drop means of the precision reference potential circuit means less the potential drop across the still another diode of the matching diode drop reference potential circuit means, and p. said voltage drop means bias current network, said diode bias currentnetwork, and said unity gain, differentially summing amplifier being mutually cooperative to cause the magnitudes of bias currents through the clamping diode of each clamping means and of bias currents through the still another diode of the matching diode drop reference potential circuit to be substantially equal.

2. Circuit apparatus for producing an analog representation of a series of concurrently present binary input signals which respectively respresent binary digital values weighted in accordance with a predetermined series of bit position values, said circuit apparatus comprising:

a. a current scaling network comprising a corresponding series of impedance branches, each of which has an energizable end and is adapted to scale current as a predetermined function of the corresponding bit position value, b. a first voltage source providing a first circuit apparatus operating potential having a first predetermined magnitude, c. a second voltage source providing a second circuit apparatus operating potential having a second predetermined magnitude less than said first predetermined magnitude, d. a corresponding series of complementarily acting solid state switch device pairs, each pair comprising one and another switch devices, said one switch device of each switch device pair having a gate electrode and a sink-source path which in its conductive state exhibits a first predetermined impedance, said another switch device of each switch device pair having a gate electrode and a sink-source path which in its conductive state exhibits a second predetermined impedance greater than said first predetermined impedance, the gate electrodes of the one and another switch devices of each switch device pair being electrically joined together and adapted to receive the corresponding binary input signal of said series of binary input signals, said sink-source paths of the one and the another switch devices of each switch device pair being mutually complementarily switched between an open circuit and a closed circuit condition in response to change of state of binary input signal applied to the associated electrically joined gate electrodes;

e. said sink-source paths of said one and another switch units of each switch device pair being serially connected in series circuit between ground reference and said first voltage source and in that order, f. each switch device pair having a circuit junction point where the sink-source paths of the one and another switch units are joined in series circuit;

g. the energizable end of each impedance branch of the series of impedance branches being connected to the circuit junction point of the corresponding switch device pair; and h. a corresponding series of like clamping diodes, each clamping diode of said series having one of its electrodes coupled to said circuit junction of the corresponding switch device pair and the other coupled to said second voltage source, the clamping diodes of the series having like predetermined forward voltage drop characteristics, each clamping diode of the series being so poled to conduct when the sink-source path of said another switch unit of the corresponding switch device pair is in its closed circuit condition, whereby the energizable ends of the impedance branches are energized by an accurately predetermined magnitude of potential.

3. Apparatus in accordance with claim 2, wherein:
 a. said series of impedance branches have respective impedances which successively increase from a third predetermined minumum impedance of the first branch of said series and the other ends of each impedance branch of the series of impedance branches being connected to a common circuit junction point, and
 b. the first predetermined impedance of each one switch device of each switch device pair being small relative to said third predetermined minumum impedance.

4. Apparatus in accordance with claim 3, wherein:
 a. the second predetermined impedance of each another switch device of each switch device pair cooperates with the corresponding clamping diode to establish a desired operating current through the clamping diode when in its conductive state.

5. Apparatus in accordance with claim 2, wherein:
 a. each one switch device of each switch device pair is an n-channel type MOSFET device,
 b. each another switch unit of each switch device pair is a p-channel type MOSFET device.

6. Circuit apparatus for producing an analog representation of a series of concurrently present binary input signals which respectively represent binary digital values weighted in accordance with a predetermined series of bit position values, said circuit apparatus comprising:
 a. a current scaling network comprising a corresponding series of impedance branches, each of which has an energizable end and is adapted to scale current as a predetermined function of the corresponding bit position value,
 b. a first voltage source providing a first circuit apparatus operating potential having a first predetermined magnitude,
 c. a second variable voltage source providing a second circuit apparatus operation potential having a maximum magnitude which is less than said first predetermined magnitude,
 d. a corresponding series of complementarily acting FET-type switch device pairs, each pair comprising first and second FET switch devices respectively of first and second predetermined opposite transistor polarity types, said first and second FET switch devices each having a gate electrode and a sink-source path under control of said gate electrodes of the first and second FET devices of each FET switch device pair being electrically joined together and adapted to receive the corresponding binary input signal of the series of binary input signals, said sink-source path of the first and second FET switch devices of each FET switch device pair being mutually complementarily switched between open circuit and closed circuit conditions in response to change of state of binary input signal applied to the associated electrically joined gate electrodes,
 e. said sink-source path of said first and second FET switch devices of each FET switch device pair being connected in series circuit between ground reference and said voltage source and in that order,
 f. each FET switch device pair having a circuit junction point where the sink-source paths of the first and second FET switch devices are joined in series circuit,
 g. the energizable end of each impedance branch of the series of impedance branches being connected to the circuit junction point of the corresponding FET switch device pair,
 h. a corresponding series of like clamping diodes, each clamping diode of said series having one of its electrodes coupled to said circuit junction of the corresponding FET switch device pair and the other coupled to said second variable voltage source, the clamping diodes of the series having like predetermined forward voltage drop characteristics, each clamping diode of the series being so poled to conduct when the sink-source path of said second FET switch of the corresponding FET switch device pair is in its closed circuit condition, and
 i. said second variable voltage source including first means for establishing a fixed reference voltage, second means for simulating the magnitude of forward voltage drop across the individual clamping diodes of said series of clamping diodes, and third means for subtracting said simulated forward voltage drop from said fixed reference voltage to very the second voltage source output in a manner which causes the potential at the energizable ends of the impedance branches of the current scaling network to be compensated against variations in forward voltage drop across the clamping diodes.

7. Apparatus in accordance with claim 6, wherein:
 a. said first means for establishing a predetermined fixed voltage comprises a precise voltage drop unidirectional device and an associated unidirectional device bias current network,
 b. said second means for simulating the magnitude of forward voltage drop across the individual clamping diodes comprises a simulator diode like those of the series of clamping doide and an associated simulator diode bias current network,
 c. said unidirectional device bias current network comprising the sink-source path of another FET device like the second FET devices of the FET switch device pairs and another simulator diode like those of the series of clamping diodes, and
 d. said simulator diode bias current network comprising the sink-source path of still another FET device like those of the second FET switch devices of the series of FET switch device pairs and another like precise voltage drop unidirectional device.

8. Apparatus in accordance with claim 8, wherein said third means comprises a unitary gain, differentially summing amplifier.

9. Apparatus in accordance with claim 6, wherein:
 a. each first FET switch device is an n-channel type MOSFET device, and
 b. each second FET switch device is a p-channel type MOSFET device.

* * * * *